(12) United States Patent
Nakajima

(10) Patent No.: US 7,820,476 B2
(45) Date of Patent: Oct. 26, 2010

(54) METHOD FOR MANUFACTURING A SEMICONDUCTOR DEVICE

(75) Inventor: Kazuaki Nakajima, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/248,143

(22) Filed: Oct. 9, 2008

(65) Prior Publication Data
US 2009/0098693 A1    Apr. 16, 2009

(30) Foreign Application Priority Data
Oct. 16, 2007    (JP)    ............ P2007-269556

(51) Int. Cl.
*H01L 29/78* (2006.01)
(52) U.S. Cl. .............. 438/99; 257/E29.255
(58) Field of Classification Search .......... 438/199; 257/407, E29.255
See application file for complete search history.

(56) References Cited
U.S. PATENT DOCUMENTS

| | | | |
|---|---|---|---|
| 6,376,888 B1 * | 4/2002 | Tsunashima et al. | ........ 257/407 |
| 6,784,508 B2 * | 8/2004 | Tsunashima et al. | ........ 257/411 |
| 2002/0140036 A1 | 10/2002 | Ma et al. | |
| 2003/0205767 A1 | 11/2003 | Ma et al. | |
| 2005/0037580 A1 | 2/2005 | Nakajima et al. | |

FOREIGN PATENT DOCUMENTS

JP    2002-329794    11/2002

* cited by examiner

*Primary Examiner*—W. David Coleman
*Assistant Examiner*—Daniel Shook
(74) *Attorney, Agent, or Firm*—Finnegan, Henderson, Farabow, Garrett & Dunner, L.L.P.

(57) ABSTRACT

A method for manufacturing a semiconductor device includes: forming a first region and a second region at a main surface of a semiconductor substrate; forming a gate insulating film containing Hf or Zr and oxygen on the first region and the second region; forming a first metallic film on the gate insulating film; forming a second metallic film on the first metallic film; removing a portion of the second metallic film; forming a third metallic film on the second metallic film and a portion of the first metallic film exposed by removing the portion of the second metallic film; and thermally treating so that constituent elements of the second metallic film is diffused into the gate insulating film via the first metallic film.

20 Claims, 14 Drawing Sheets

METHOD FOR MANUFACTURING A SEMICONDUCTOR DEVICE

CROSS-REFERENCE TO RELATED APPLICATIONS

This application is based upon and claims the benefit of priority from the prior Japanese Patent Application No. 2007-269556 filed on Oct. 16, 2007; the entire contents which are incorporated herein by reference.

BACKGROUND OF THE INVENTION

1. Field of the Invention

The present invention relates to a method for manufacturing a semiconductor device, particularly having a MIS (Metal Insulator Semiconductor Field Effect Transistor) using a conductive film as the gate electrode thereof.

2. Description of the Related Art

As of now, the miniaturization of a device is pursued so as to enhance the performance of the MISFET thereof. In the transistor with a gate electrode made of a conventional polysilicon, the depletion of the gate electrode can not be neglected and causes some problems. In this point of view, recently, the gate electrode is made of a metallic material instead of the conventional polysilicon.

In the conventional polysilicon gate electrode structure (containing a polycide structure, a salicide structure and a poluymetal structure), the threshold voltage of the transistor is determined on the impurity concentrations of the channel region and the polysilicon film. In the metal gate structure, however, the threshold voltage is determined on the impurity concentration of the channel region and the work function of the gate electrode. Therefore, the metal gate is required to have the work functions suitable for the NMOS (N Channel Metal Oxide Semiconductor) and the PMOS (P Channel Metal Oxide Semiconductor). For example, it is desired that the work function of the metal gate is set to 4.8 eV or more for the PMOS and the work function of the metal gate is set to 4.3 eV or below for the NMOS.

In the case that two kinds of metal gates are employed, one of the two kinds of metal gates is applied for the NMOS and the other of the two kinds of metal gates is applied for the PMOS (refer to Reference 1). In this case, however, the one or the other of the two kinds of metal gates is required to be removed so that the surface of the gate insulating film is exposed to air, the etching solution or etching gas and thus, the reliability of the gate insulating film is remarkably deteriorated.

[Reference 1] JP-A 2002-329794 (KOKAI)

BRIEF SUMMARY OF THE INVENTION

An aspect of the present invention relates to a method for manufacturing a semiconductor device, including: forming a first region and a second region at a main surface of a semiconductor substrate; forming a gate insulating film containing Hf or Zr and oxygen on the first region and the second region; forming a first metallic film on the gate insulating film; forming a second metallic film on the first metallic film; removing a portion of the second metallic film; forming a third metallic film on the second metallic film and a portion of the first metallic film exposed by removing the portion of the second metallic film; and thermally treating so that constituent elements of the second metallic film is diffused into the gate insulating film via the first metallic film.

Another aspect of the present invention relates to a method for manufacturing a semiconductor device, including: forming a first region and a second region at a main surface of a semiconductor substrate; forming a gate insulating film containing Hf or Zr and oxygen on the first region and the second region; forming a first metallic film on the gate insulating film; forming a second metallic film on the first metallic film; removing a portion of the second metallic film above the second region so as to expose a portion of the first metallic film above the second region while a portion of the second metallic film above the first region remains; forming a third metallic film on the second metallic film and the portion of the first metallic film exposed by removing the portion of the second metallic film; removing a portion of the third metallic film above the first region so as to expose a portion of the second metallic film above the first region while a portion of the third metallic film above the second region remains; forming a fourth metallic film on said exposed portion of said second metallic film and said third metallic film; and thermally treating so that constituent elements of the second metallic film are diffused into a portion of the gate insulating film in the first region and constituent elements of the third metallic film are diffused into a portion of the gate insulating film in the second region.

DETAILED DESCRIPTION OF THE INVENTION

Then, some embodiments will be described with reference to the drawings.

First Embodiment

FIGS. 1 to 9 are cross sectional views schematically showing the steps in a method for manufacturing a semiconductor device according to a first embodiment.

Figure 1:
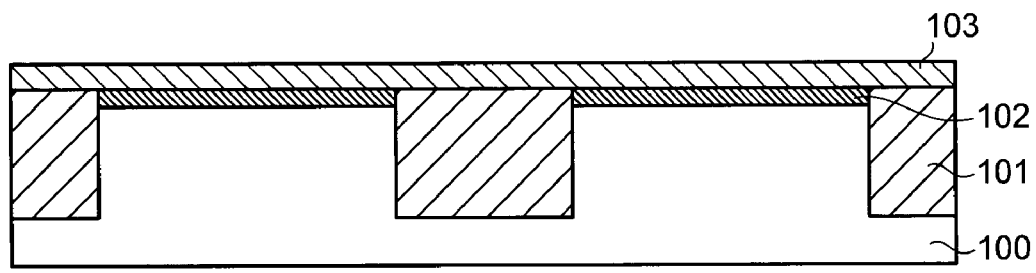
FIG. 1 is a cross sectional view schematically showing one step in a method for manufacturing a semiconductor device according to a first embodiment.

As shown in FIG. 1, a monocrystalline silicon substrate 100 includes element regions such as NMOS regions and PMOS regions separated by element separation layers 101. In this embodiment, attention is paid to one NMOS region and one PMOS region. First of all, a gate insulating film 102 is formed of hafnium-based oxide on the element regions, e.g., by means of CVD (Chemical Vapor Deposition) using organic sources. Then, a first metallic film 103 is formed as a WSi film with a thickness of 5 nm and with a work function of 4.3 eV, e.g., by means of CVD using organic sources.

Herein, the NMOS region means a region for an N-channel MOS transistor to be formed and the PMOS region means a region for a P-channel MOS transistor to be formed.

Figure 2:
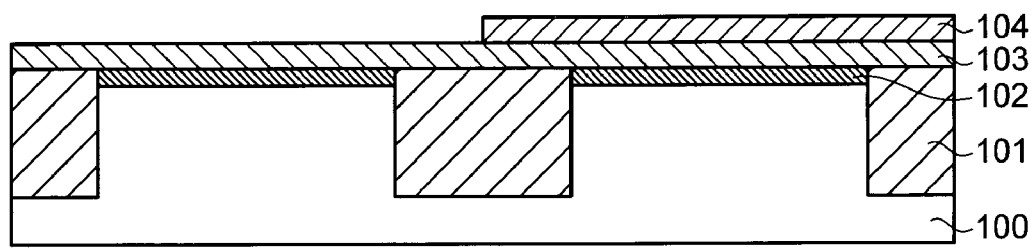
FIG. 2 is a cross sectional view schematically showing one step in the manufacturing method according to the first embodiment.

Then, as shown in FIG. 2, a second metallic film 104 is formed as a TiAlN film on the WSi film 103 by means of CVD, and a resist mask is formed on a portion of the TiAlN film 104 belonging to the PMOS region so that a portion of the TiAlN film 104 belonging to the NMOS region can be peeled off from the WSi film 103. In this case, since the gate insulating film 102 is covered with the WSi film 103, the TiAln film 104 can be peeled off under the condition that the insulating film 102 is not exposed to air and the etching solution or etching gas for the TiAlN film 104.

Figure 3:
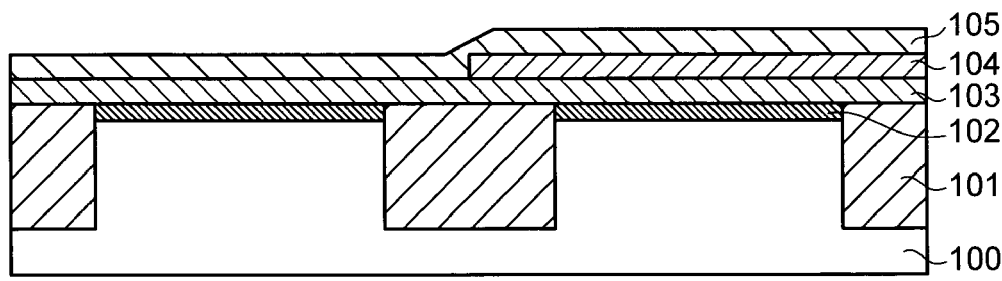
FIG. 3 is a cross sectional view schematically showing one step in the manufacturing method according to the first embodiment.

Then, as shown in FIG. 3, a third metallic film 105 is formed as a TiN film with a thickness of 5 nm on the TiAlN film 104 and the exposed portion of the WSi film 103 formed by peeling off the portion of the TiAlN film 104. In this case, the TiN film 105 functions as a barrier metal and thus, may be omitted if the TiAlN film 104 is not reacted with a conductive layer 106 to be described hereinafter.

Figure 4:
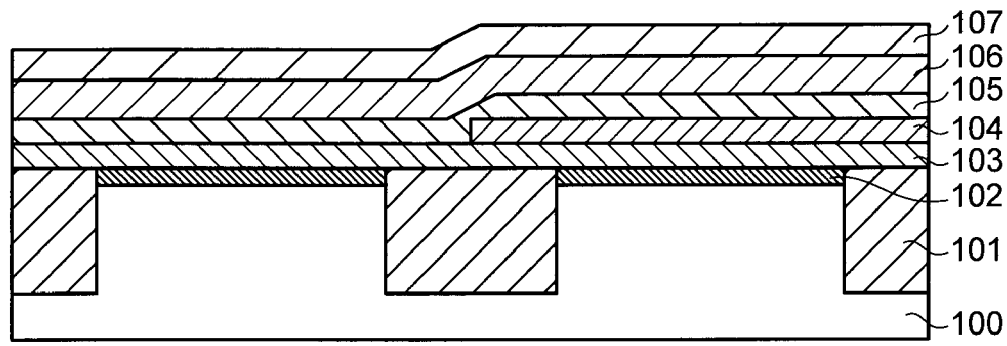
FIG. 4 is a cross sectional view schematically showing one step in the manufacturing method according to the first embodiment.

Then, as shown in FIG. 4, the conductive layer 106 is formed of polysilicon film in a thickness of 80 nm on the TiN film 105, and P$^+$ ions are implanted into a portion of the conductive layer belonging to the NMOS region and B$^+$ ions are implanted into a portion of the conductive layer belonging to the PMOS region. Then, a silicon nitride film 107 is formed in a thickness of 100 nm on the polysilicon film 106.

Figure 5:
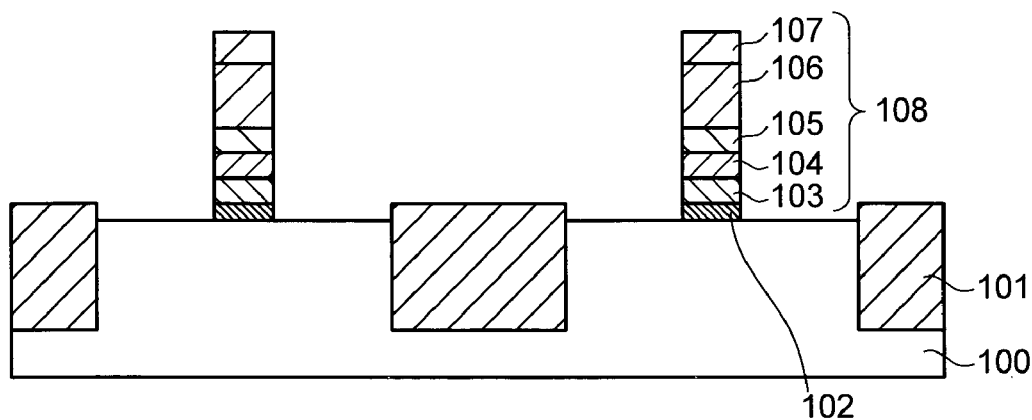
FIG. 5 is a cross sectional view schematically showing one step in the manufacturing method according to the first embodiment.

Then, as shown in FIG. 5, the silicon nitride film 107, the polysilicon film 106, the TiN film 105, the TiAlN film 104, the WSi film 103 are subsequently and anisotropically etched in a gate width of 30 nm to form gate electrodes 108 for the NMOS region and the PMOS region.

Figure 6:
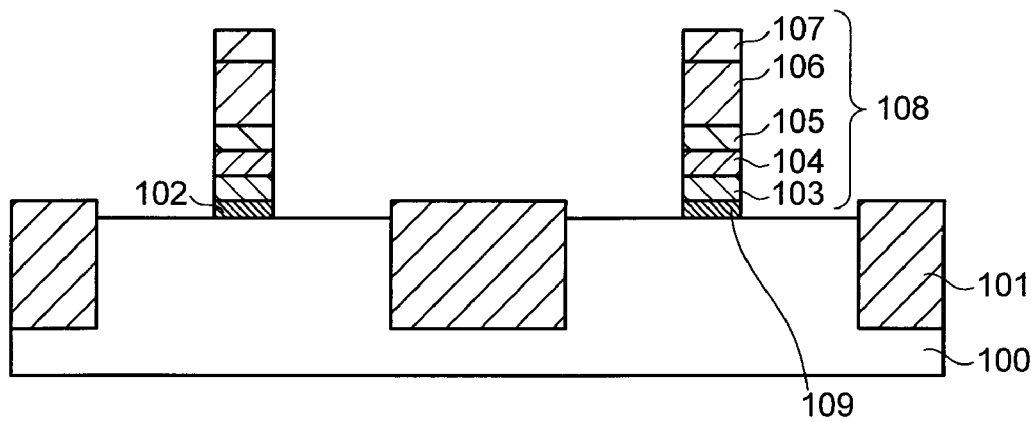
FIG. 6 is a cross sectional view schematically showing one step in the manufacturing method according to the first embodiment.

After the gate electrodes 108 are formed, as shown in FIG. 6, the thus obtained assembly is thermally treated at 1000° C. for one seconds under nitrogen atmosphere. Since the TiAlN film 104 can exhibit poor heat-resistance, the TiAlN film 104 may be separated into the TiN phase and the AlN phase due to high temperature thermal treatment. In this case, although excess Al elements are discharged from the TiAlN film 104, the excess Al element are diffused into the gate insulating film 102 via the WSi film 103 located below the TiAlN film 104 to form an Al-containing gate insulating film 109. In contrast, since the TiN film 105 located above the TiAlN film 104 can function as reaction-preventing layer, the excess Al elements can not be diffused upward via the TiN film 105.

The Al elements diffused into the gate insulating film 102 are reacted with oxygen elements in the gate insulating film to form dipoles made of Al—O connection. In this case, the effective work function of the WSi film 103 becomes larger (e.g., >4.8 eV) than the inherent work function thereof by the affection of the dipoles of Al—O connection. Namely, the work function of a portion of the WSi film 103 in the vicinity of the gate insulating film 102 (109) is increased.

Then, the concrete function of the Al elements will be described hereinafter. For example, when a gate insulating film made of HfSiO$_4$ is prepared and the Al elements are contacted with the gate insulating film, the reaction can be represented by the equation (1) and proceeds from the left-side hand to the right-hand side thermodynamically. The proceeding direction of the reaction is determined whether the difference ($\Delta$G) in Gibbs free energy of the reaction system becomes positive or negative.

When Ga elements and In elements which belong to III group in Periodic Table similar to the Al elements are employed instead of the Al elements, the reactions can be represented by the equations (2) and (3). In these cases, however, since the difference ($\Delta$G) in Gibbs free energy of the reaction system becomes positive, the reactions represented by the equations (2) and (3) proceeds only from the right-hand side to the left-hand side but can not vise versa. In the reaction systems using the Ga elements and the In elements, therefore, no dipole is formed so as not to exhibit the same function as the Al elements.

Al+HfSiO$_4$=Al$_2$O$_3$+HfO$_2$+Si+$\Delta$G (1)

Ga+HfSiO$_4$=Ga$_2$O$_3$+HfO$_2$+Si+$\Delta$G (2)

In+HfSiO$_4$=In$_2$O$_3$+HfO$_2$+Si+$\Delta$G (3)

Figure 7:
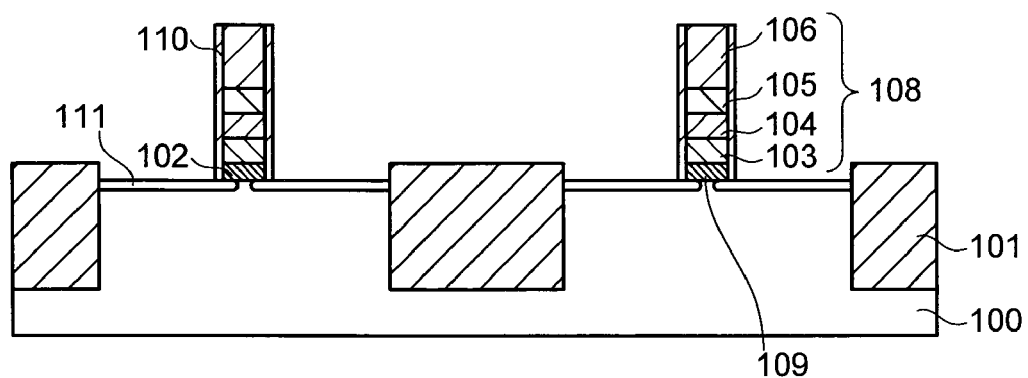
FIG. 7 is a cross sectional view schematically showing one step in the manufacturing method according to the first embodiment.

After the Al-containing gate insulating film 109 is formed, as shown in FIG. 7, a silicon nitride film is formed and etched back to form silicon nitride side walls 110 at both sides of the gate electrodes 108, respectively. Moreover, As$^+$ ions are implanted into the NMOS region using the gate electrode 108 as a mask and B$^+$ ions are implanted into the PMOS region using the gate electrode 108 as a mask, and heated at 800° C. for five seconds to form shallow diffusion layers 111, respectively.

Figure 8:
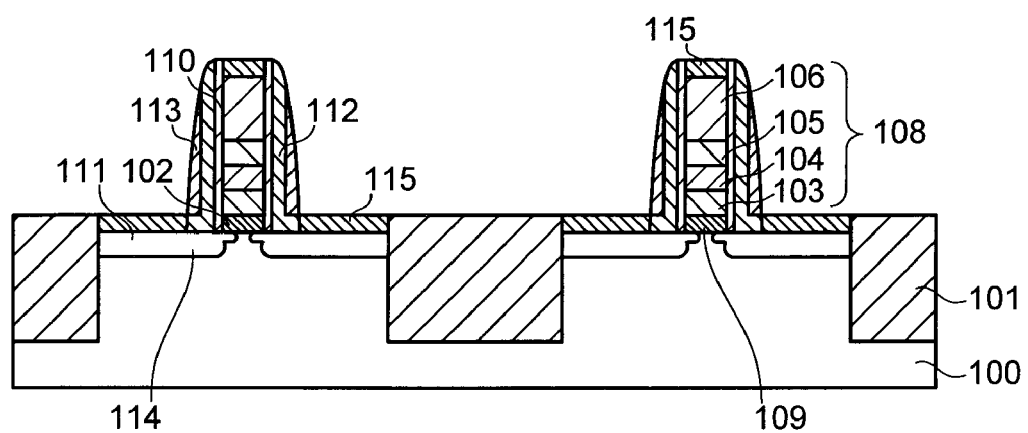
FIG. 8 is a cross sectional view schematically showing one step in the manufacturing method according to the first embodiment.

Thereafter, as shown in FIG. 8, a silicon oxide film and a silicon nitride film are formed and etched back to form silicon oxide side films 112 and silicon nitride side films 113 so as to cover the side walls of the gate electrodes 108, respectively. Then, P$^+$ ions are implanted into the NMOS region using the gate electrode 108 as a mask and B$^+$ ions are implanted into the PMOS region using the gate electrode 108 as a mask, and heated at 1030° C. for five seconds to form deep diffusion layers 114, respectively. The shallow diffusion layers 111 and the deep diffusion layers 114 constitute source/drain regions. Then, a Ni film is formed in a thickness of 10 nm so as to entirely cover the thus obtained assembly, and heated at 350° C. for 30 seconds so as to be reacted with the silicon substrate 100. In this case, the unreacted Ni film is removed by the mixture of sulfuric acid solution and hydrogen peroxide solution. Thereafter, thus obtained assembly is heated at 500° C. for 30 seconds to form silicide layers 115 on the shallow diffusion layers 111, respectively.

Figure 9:
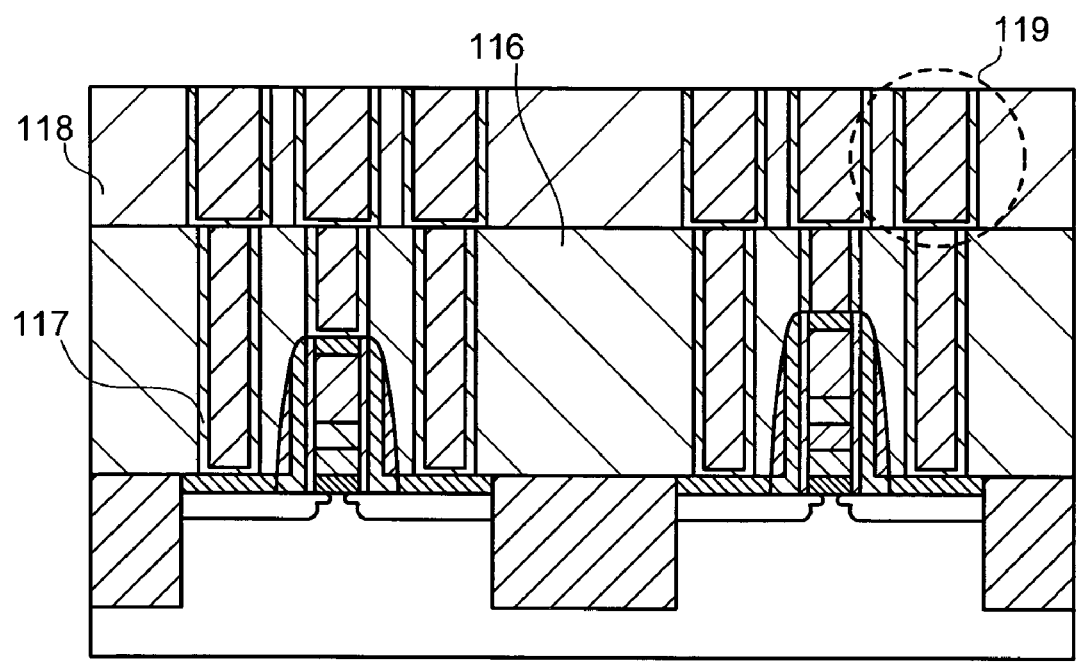
FIG. 9 is a cross sectional view schematically showing one step in the manufacturing method according to the first embodiment.

Then, as shown in FIG. 9, a first interlayer film 116 is formed so as to flatten the surface of the assembly, and contact holes are formed at the first interlayer film 116. Then, Ti/TiN/W films are formed so as to embed the contact holes, and flattened by means of CMP to form contacts 117. Then, a second interlayer film 118 is formed on the first interlayer film 116 containing the contacts 117, and wiring trenches are formed at the second interlayer film 118. Then, TaN/Cu films are formed so as to embed the wiring trenches, and flattened by means of CMP to form Cu wires 119 electrically connected with the contacts 117.

In this embodiment, the intended metal gate transistors with the work functions suitable for the NMOS and PMOS can be realized while the gate insulating film is not exposed to air and the like.

In this embodiment, the high temperature thermal treatment is conducted in the step relating to FIG. 6 because the TiAlN film causes the phase separation and diffuse the thus obtained Al elements, but may be omitted because the TiAlN film can cause the phase separation and diffuse the Al elements by the thermal treatment for the formation of the Al-containing gate insulating film 109.

Moreover, the gate insulating film 102 may be made of a zirconium-based oxide material in addition to the hafnium-based oxide material. The second metallic film 104 may be made of TaAlN or WAlN in addition to TiAlN. The third metallic film 105 may be made of TaN or WN which is utilized for barrier metal in addition to TiN.

Particularly, in the case that the second metallic film 104 contains constituent elements of the third metallic film 105 as the second metallic film 104 is made of TaAlN and the third metallic film 105 is made of TaN, both of the second metallic film 104 and the third metallic film 105 can be easily processed (e.g., etched).

Second Embodiment

FIGS. 10 to 15 are cross sectional views schematically showing the steps in a method for manufacturing a semiconductor device according to a second embodiment.

Figure 10:
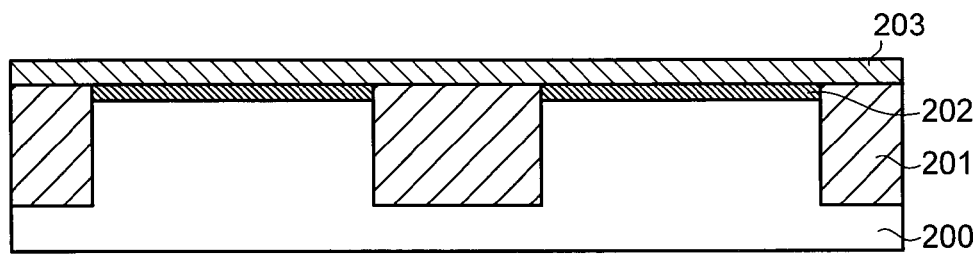
FIG. 10 is a cross sectional view schematically showing one step in a method for manufacturing a semiconductor device according to a second embodiment.

As shown in FIG. 10, a monocrystalline silicon substrate 200 includes element regions such as NMOS regions and PMOS regions separated by element separation layers 201. In this embodiment, attention is paid to one NMOS region and one PMOS region. First of all, a gate insulating film 202 is formed of hafnium-based oxide on the element regions, e.g., by means of CVD using organic sources. Then, a first metallic film 203 is formed as a W film with a thickness of 5 nm and with a work function of 4.8 eV, e.g., by means of PVD.

Figure 11:
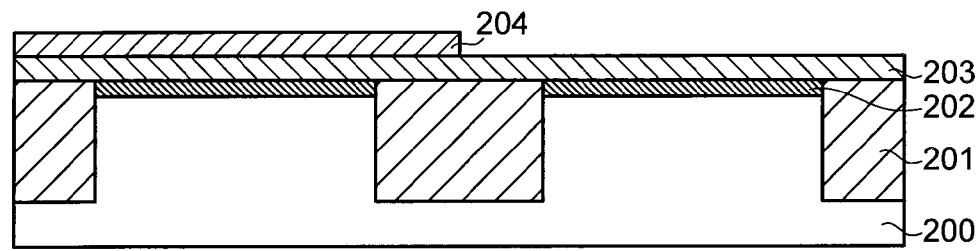
FIG. 11 is a cross sectional view schematically showing one step in the manufacturing method according to the second embodiment.

Then, as shown in FIG. 11, a second metallic film 204 is formed as a TiTbN film with a thickness of 5 nm on the W film 203 by means of PVD, and a resist mask is formed on a portion of the TiTbN film 204 belonging to the NMOS region by means of photolithography so that a portion of the TiTbN film 204 belonging to the PMOS region can be peeled off from the W film 203. In this case, since the gate insulating film 202 is covered with the W film 203, the TiTbN film 204 can be peeled off under the condition that the insulating film 202 is not exposed to air and the etching solution or etching gas for the TiTbN film 204.

Figure 12:
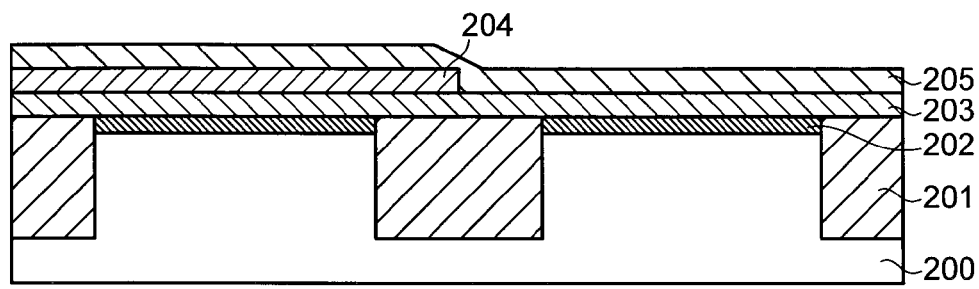
FIG. 12 is a cross sectional view schematically showing one step in the manufacturing method according to the second embodiment.

Then, as shown in FIG. 12, a third metallic film 205 is formed as a TiN film with a thickness of 5 nm on the TiTbN film 204 and the exposed portion of the W film 203 formed by peeling off the portion of the TiTbN film 204. In this case, the TiN film 205 functions as a barrier metal and thus, may be omitted if the TiTbN film 204 is not reacted with a conductive layer 206 to be described hereinafter.

Figure 13:
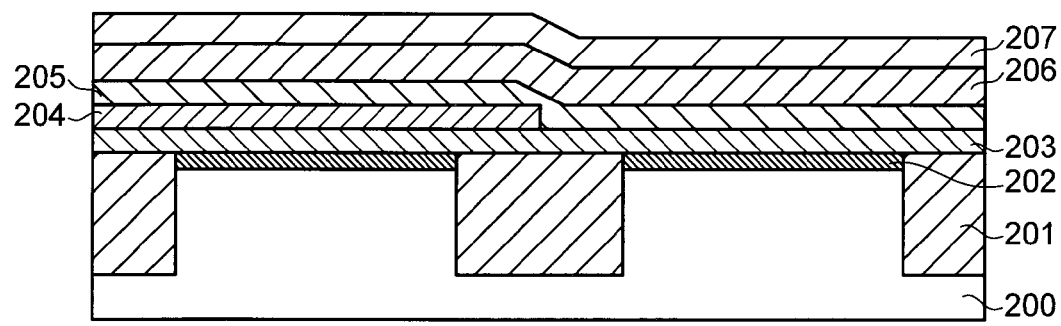
FIG. 13 is a cross sectional view schematically showing one step in the manufacturing method according to the second embodiment.

Then, as shown in FIG. 13, the conductive layer 206 is formed as a polysilicon film with a thickness of 80 nm on the TiTbN film 204, and a silicon nitride film 207 is formed in a thickness of 150 nm on the conductive layer 206.

Figure 14:
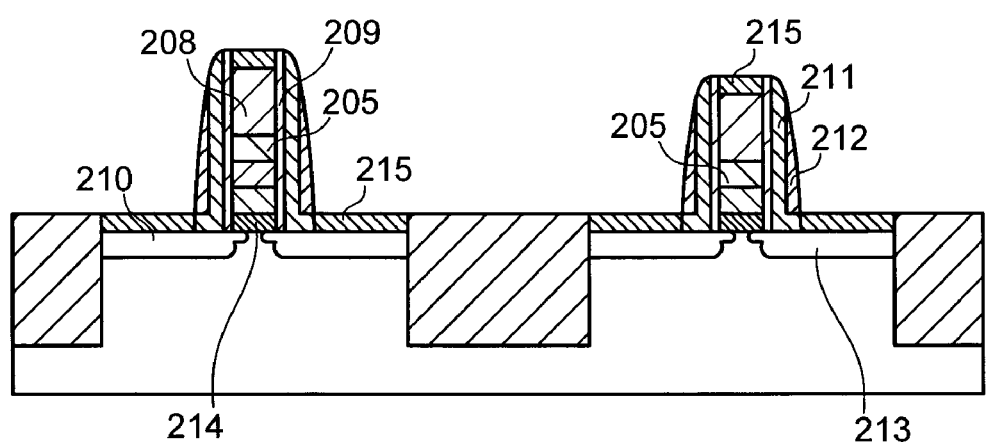
FIG. 14 is a cross sectional view schematically showing one step in the manufacturing method according to the second embodiment.

Then, as shown in FIG. 14, the silicon nitride film 207, the W film 206, the TiN film 205, the TiTbN film 204, the W film 203 are subsequently and anisotropically etched in a gate width of 30 nm to form gate electrodes 208 for the NMOS region and the PMOS region. Thereafter, a silicon nitride film is formed and etched back to form silicon nitride side films 209 so as to cover the side walls of the gate electrodes 208, respectively.

Then, As$^+$ ions are implanted into the NMOS region using the gate electrode 208 as a mask and P$^+$ ions are implanted into the PMOS region using the gate electrode 208 as a mask, and heated at 800° C. for five seconds to form shallow diffusion layers 210, respectively.

Then, a silicon oxide film and a silicon nitride film are formed and etched back to form silicon oxide side films 211 and silicon nitride side films 212 so as to cover the side walls of the gate electrodes 208, respectively. Then, P$^+$ ions are implanted into the NMOS region using the gate electrode 208 as a mask and B$^+$ ions are implanted into the PMOS region using the gate electrode 208 as a mask, and heated at 1030° C. for five seconds to form deep diffusion layers 213, respectively. The shallow diffusion layers 210 and the deep diffusion layers 213 constitute source/drain regions. Since the TiTbN film 204 can exhibit poor heat-resistance, the TiTbN film 204 may be separated into the TiN phase and the TbN phase due to the high temperature thermal treatment. In this case, although excess Tb elements are discharged from the TiTbN film 204, the excess Tb element are diffused into the gate insulating film 202 via the W film 203 located below the TiTbN film 204 to form a Tb-containing gate insulating film 214. In contrast, since the TiN film 205 located above the TiTbN film 204 can function as reaction-preventing layer, the excess Tb elements can not be diffused upward via the TiN film 205.

The Tb elements diffused into the gate insulating film 202 are reacted with oxygen elements in the gate insulating film to form dipoles made of Tb—O connection. In this case, the effective work function of the W film 203 becomes smaller (e.g., <4.3 eV) than the inherent work function thereof by the affection of the dipoles of Tb—O connection. Namely, the work function of a portion of the W film 203 in the vicinity of the gate insulating film 202 (214) is decreased.

Then, the concrete function of the Tb elements will be described hereinafter. For example, when a gate insulating film made of $HfSiO_4$ is prepared and the Tb elements are contacted with the gate insulating film, the reaction can be represented by the equation (4) and proceeds from the left-side hand to the right-hand side thermodynamically.

The equation (4) can be established for another IIIa Group element similar to Tb by substituting Tb with another IIIa Group element.

$$Tb + HfSiO_4 = Tb_2O_3 + HfO_2 + Si \quad (4)$$

The equation (4) can be established for IIa Group element. For example, when a gate insulating film made of $HfSiO_4$ is prepared and Mg elements are contacted with the gate insulating film, the reaction can be represented by the equation (5) and proceeds from the left-side hand to the right-hand side.

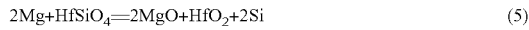

$$2Mg + HfSiO_4 = 2MgO + HfO_2 + 2Si \quad (5)$$

Then, a Ni film is formed in a thickness of 10 nm so as to entirely cover the thus obtained assembly, and heated at 350° C. for 30 seconds so as to be reacted with the silicon substrate 200. In this case, the unreacted Ni film is removed by the mixture of sulfuric acid solution and hydrogen peroxide solution. Thereafter, thus obtained assembly is heated at 500° C. for 30 seconds to form silicide layers 215 on the shallow diffusion layers 210, respectively. In this case, since the W film 203 is covered with the silicon nitride film 207 of the gate electrodes 208, the W film 203 is not exposed to the mixture of sulfuric acid solution and hydrogen peroxide solution.

Figure 15:
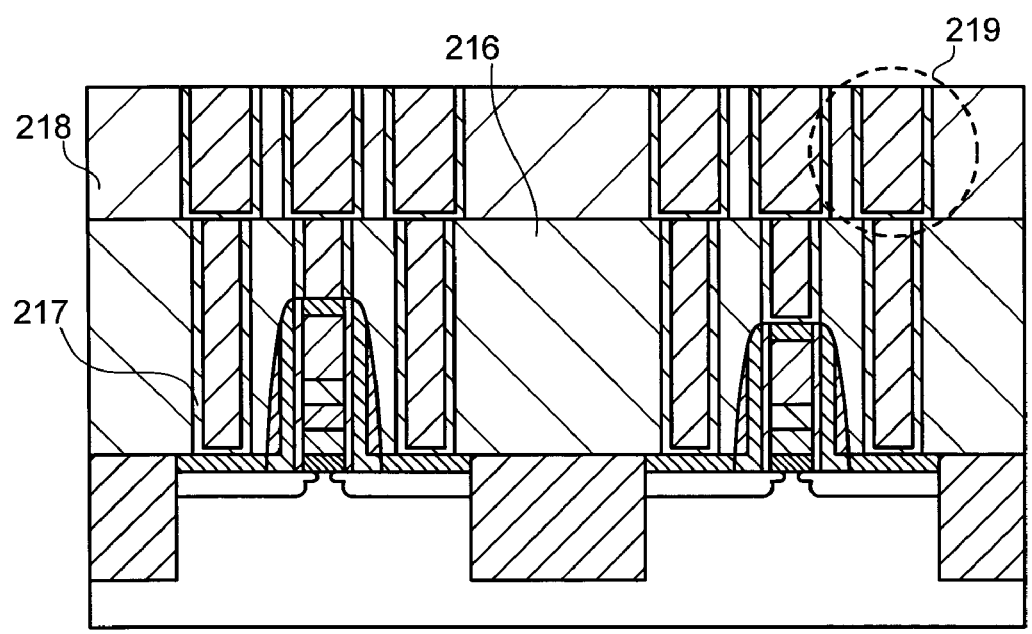
FIG. 15 is a cross sectional view schematically showing one step in the manufacturing method according to the second embodiment.

Then, as shown in FIG. 15, a first interlayer film 216 is formed so as to flatten the surface of the assembly, and contact holes are formed at the first interlayer film 216. Then, Ti/TiN/W films are formed so as to embed the contact holes, and flattened by means of CMP to form contacts 217. Then, a second interlayer film 218 is formed on the first interlayer film 216 containing the contacts 217, and wiring trenches are formed at the second interlayer film 218. Then, TaN/Cu films are formed so as to embed the wiring trenches, and flattened by means of CMP to form Cu wires 219 electrically connected with the contacts 217.

In this embodiment, the intended metal gate transistors with the work functions suitable for the NMOS and PMOS can be realized while the gate insulating film is not exposed to air and the like.

In this embodiment, the gate insulating film 202 may be made of a zirconium-based oxide material in addition to the hafnium-based oxide material. The second metallic film 204 may be made of TaTbN or WTbN in addition to TiTbN. The third metallic film 205 may be made of TaN or WN which is utilized for barrier metal in addition to TiN.

Particularly, in the case that the second metallic film 204 contains constituent elements of the third metallic film 205 as the second metallic film 204 is made of TaTbN and the third metallic film 205 is made of TaN, both of the second metallic film 204 and the third metallic film 205 can be easily processed (e.g., etched).

In this embodiment, Tb elements are diffused into the gate insulating film 202, but another IIIa elements may be diffused.

Third Embodiment

FIGS. 16 to 22 are cross sectional views schematically showing the steps in a method for manufacturing a semiconductor device according to a third embodiment.

Figure 16:
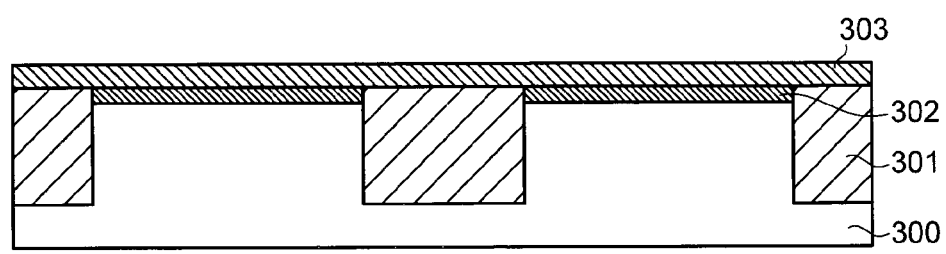
FIG. 16 is a cross sectional view schematically showing one step in a method for manufacturing a semiconductor device according to a third embodiment.

As shown in FIG. 16, a monocrystalline silicon substrate 300 includes element regions such as NMOS regions and PMOS regions separated by element separation layers 301. In this embodiment, attention is paid to one NMOS region and one PMOS region. First of all, a gate insulating film 302 is formed of hafnium-based oxide on the element regions, e.g., by means of CVD using organic sources. Then, a first metallic film 303 is formed as a W film with a thickness of 5 nm by means of PVD.

Figure 17:
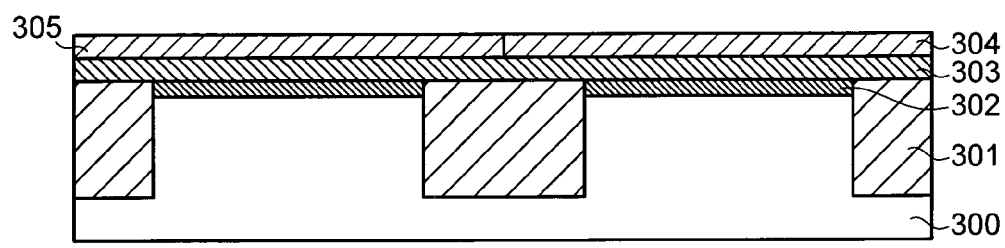
FIG. 17 is a cross sectional view schematically showing one step in the manufacturing method according to the third embodiment.

Then, as shown in FIG. 17, a second metallic film 304 is formed as a TiLaN film with a thickness of 5 nm on the W film 303 by means of PVD, and a resist mask is formed on a portion of the TiLaN film 304 belonging to the PMOS region by means of photolithography so that a portion of the TiLaN film 304 belonging to the NMOS region can be peeled off from the W film 303. Then, a third metallic film 305 is formed as a TiAlN film with a thickness of 5 nm on the TiLaN film 304 and the exposed portion of the W film 303 formed by peeling off the portion of the TiLaN film 304. Then, a resist mask is formed on a portion of the TiAlN film 305 belonging to the NMOS region by means of photolithography so that a portion of the TiAlN film 305 belonging to the PMOS region is peeled off. In this case, since the gate insulating film 302 is covered with the W film 303, the TiLaN film 304 and the TiAlN film 305 can be peeled off under the condition that the gate insulating film 302 is not exposed to air and the etching solution or etching gas for the TiLaN film 304 and the TiAlN film 305.

Figure 18:
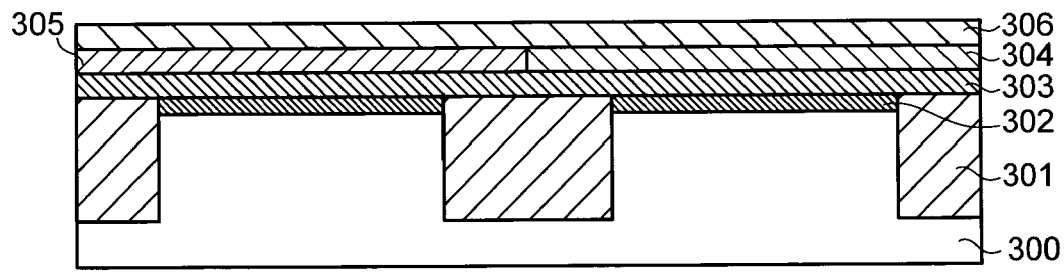
FIG. 18 is a cross sectional view schematically showing one step in the manufacturing method according to the third embodiment.

Then, as shown in FIG. 18, a fourth metallic film 306 is formed as a TiN film with a thickness of 5 nm on the TiLaN film 304 and the TiAlN film 305. In this case, the TiN film 306 functions as a barrier metal and thus, may be omitted if the TiLaN film 304 and the TiAlN film 305 are not reacted with a conductive layer 307 to be described hereinafter.

Figure 19:
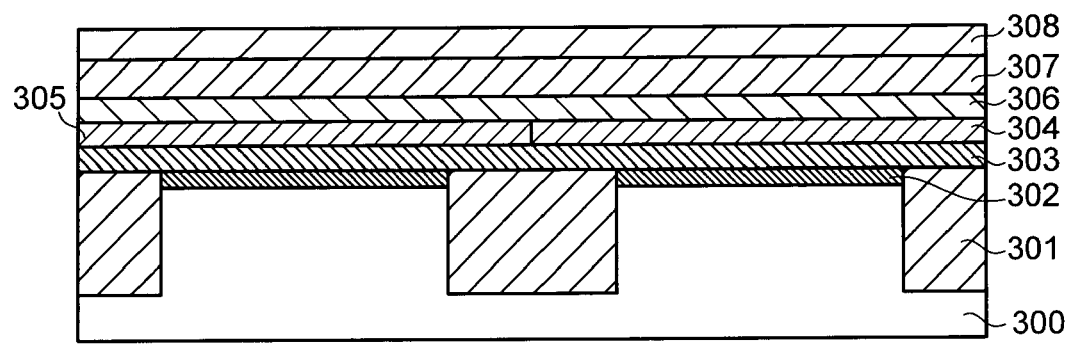
FIG. 19 is a cross sectional view schematically showing one step in the manufacturing method according to the third embodiment.

Then, as shown in FIG. 19, the conductive layer 307 is formed as a polysilicon film with a thickness of 80 nm on the TiN film 306, and $P^+$ ions are implanted into the NMOS region and $B^+$ ions are implanted into the PMOS region. Then, a silicon nitride film 308 is formed in a thickness of 100 nm on polysilicon film 307.

Figure 20:
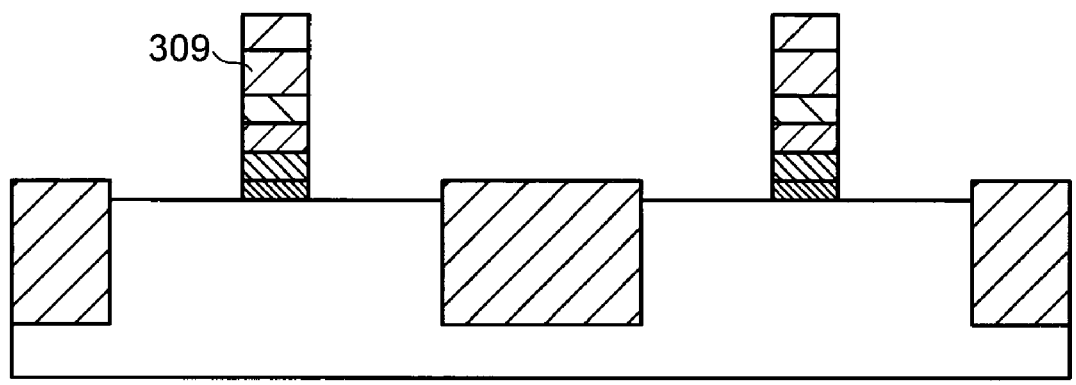
FIG. 20 is a cross sectional view schematically showing one step in the manufacturing method according to the third embodiment.

Then, as shown in FIG. 20, the silicon nitride film 308, the polysilicon film 307, the W film 306, the TiAlN film 305, the TiLaN film 304, the W film 303 are subsequently and anisotropically etched in a gate width of 30 nm to form gate electrodes 309 for the NMOS region and the PMOS region.

Figure 21:
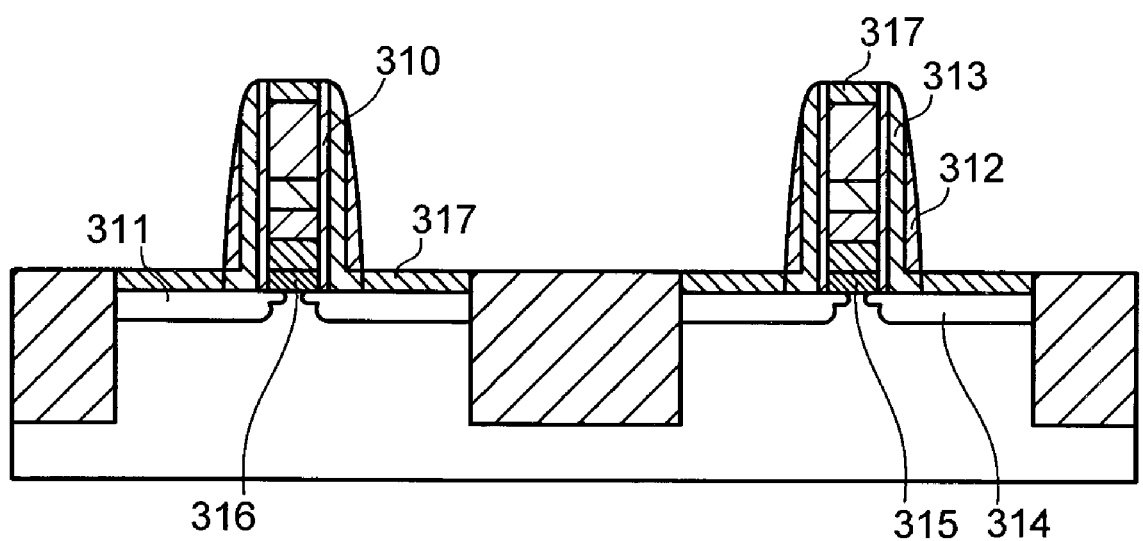
FIG. 21 is a cross sectional view schematically showing one step in the manufacturing method according to the third embodiment.

Thereafter, as shown in FIG. 21, a silicon nitride film is formed and etched back to form silicon nitride side films 310 so as to cover the sidewalls of the gate electrodes 309, respectively. Then, $As^+$ ions are implanted into the NMOS region using the gate electrode 309 as a mask and $P^+$ ions are implanted into the PMOS region using the gate electrode 309 as a mask, and heated at 800° C. for five seconds to form shallow diffusion layers 311, respectively.

Then, a silicon oxide film and a silicon nitride film are formed and etched back to form silicon oxide side films 312 and silicon nitride side films 313 so as to cover the side walls of the gate electrodes 309, respectively. Then, $P^+$ ions are implanted into the NMOS region using the gate electrode 309 as a mask and $B^+$ ions are implanted into the PMOS region using the gate electrode 208 as a mask, and heated at 1030° C. for five seconds to form deep diffusion layers 314, respectively. The shallow diffusion layers 311 and the deep diffusion layers 314 constitute source/drain regions. Since the TiAlN film 305 and the TiLaN film 304 can exhibit poor heat-resistance, the TiAlN film 305 may be separated into the TiN phase and the AlN phase, and the TiLaN film 304 may be separated into the TiN phase and the LaN phase. In this case, although excess Al elements and La elements are discharged from the TiAlN film 305 and the TiLaN film 304, respectively, the excess Al elements and La elements are diffused into the gate insulating film 302 via the W film 303 located below the TiAlN film 305 and the TiLaN film 304 to form an Al-containing gate insulating film 315 and a La-containing gate insulating film 316, respectively. In contrast, since the TiN film 306 located above the TiAlN film 305 and the TiLaN film 304 can function as reaction-preventing layer, the excess Al elements and La elements can not be diffused upward via the TiN film 306.

The Al elements forms dipoles made of Al—O connection in the PMOS region so that the effective work function of the PMOS region becomes larger (e.g., >4.8 eV) than the work function of the W electrode. The La elements forms dipoles made of La—O connection in the NMOS region so that the effective work function of the NMOS region becomes smaller (e.g., <4.3 eV) than the work function of the W electrode.

Then, a Ni film is formed in a thickness of 10 nm so as to entirely cover the thus obtained assembly, and heated at 350° C. for 30 seconds so as to be reacted with the silicon substrate 300. In this case, the unreacted Ni film is removed by the mixture of sulfuric acid solution and hydrogen peroxide solution. Thereafter, thus obtained assembly is heated at 500° C. for 30 seconds to form silicide layers 317 on the shallow diffusion layers 311, respectively.

Figure 22:
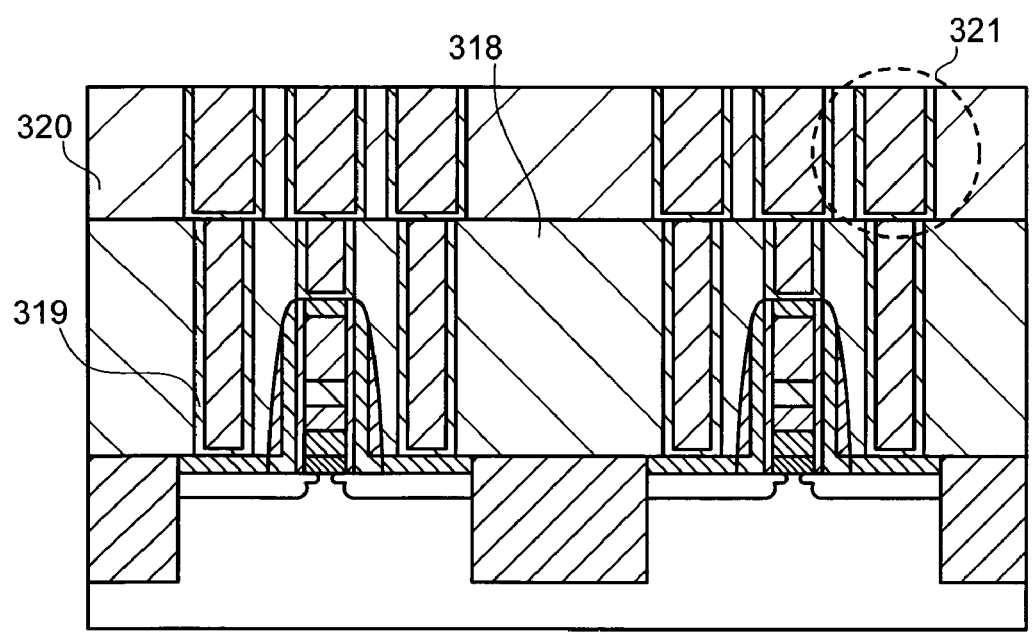
FIG. 22 is a cross sectional view schematically showing one step in the manufacturing method according to the third embodiment.

Then, as shown in FIG. 22, a first interlayer film 318 is formed so as to flatten the surface of the assembly, and contact holes are formed at the first interlayer film 318. Then, Ti/TiN/W films are formed so as to embed the contact holes, and flattened by means of CMP to form contacts 319. Then, a second interlayer film 320 is formed on the first interlayer film 318 containing the contacts 319, and wiring trenches are formed at the second interlayer film 318. Then, TaN/Cu films are formed so as to embed the wiring trenches, and flattened by means of CMP to form Cu wires 321 electrically connected with the contacts 219.

In this case, the intended metal gate transistors with the work functions suitable for the NMOS and PMOS can be realized while the gate insulating film is not exposed to air and the like.

In this embodiment, the TiLaN film 304 is formed in advance so that the portion of the TiLaN film 304 is peeled off, but the TiAlN film 305 may be formed in advance so that the portion of the TiAlN film 305 is peeled off.

In this embodiment, the gate insulating film 302 may be made of a zirconium-based oxide material in addition to the hafnium-based oxide material. The second metallic film 304 may be made of TaLaN or WLaN in addition to TiLaN. The third metallic film 305 may be made of TaLaN or WLaN in addition to TiAlN. The fourth metallic film 306 may be made of TaN or WN which is utilized for barrier metal in addition to TiN.

Particularly, in the case that the second metallic film 304 and the third metallic film 305 contains constituent elements of the fourth metallic film 306 as the second metallic film 304 is made of TaLaN, the third metallic film 305 is made of TaAlN, and the fourth metallic film 306 is made of TaN, the second metallic film 304 through the fourth metallic film 306 can be easily processed (e.g., etched).

In this embodiment, La elements are diffused into the gate insulating film 302 in the NMOS region, but another II Group elements or IIIa elements may be diffused.

What is claimed is:

1. A method for manufacturing a semiconductor device, comprising:
   forming a first region and a second region at a main surface of a semiconductor substrate;
   forming a gate insulating film containing Hf or Zr and oxygen on said first region and said second region;
   forming a first metallic film on said gate insulating film;
   forming a second metallic film on said first metallic film;
   removing a portion of said second metallic film to expose said first metallic film on said second region under the condition that said second metallic film on said first region can remain;
   forming a third metallic film on said second metallic film and a portion of said first metallic film exposed by removing said portion of said second metallic film;
   forming a gate electrode including the first metallic film, the second metallic film, and the third metallic film;
   thermally treating so that constituent elements of said second metallic film is diffused into said gate insulating film via said first metallic film at a temperature of at least 1000 ° C.; and
   after the thermally treating, forming source and drain regions using the gate electrode as a mask.

2. A method for manufacturing a semiconductor device, comprising:
   forming a first region and a second region at a main surface of a semiconductor substrate;
   forming a gate insulating film containing Hf or Zr and oxygen on said first region and said second region;
   forming a first metallic film on said gate insulating film;
   forming a second metallic film on said first metallic film;
   removing a portion of said second metallic film above said second region so as to expose a portion of said first metallic film above said second region while a portion of said second metallic film above said first region remains;
   forming a third metallic film on said second metallic film and said portion of said first metallic film exposed by removing said portion of said second metallic film;
   removing a portion of said third metallic film above said first region so as to expose a portion of said second metallic film above said first region while a portion of said third metallic film above said second region remains;
   forming a fourth metallic film on said exposed portion of said second metallic film and said third metallic film;
   forming a gate electrode including the first metallic film, one of the second metallic film and the third metallic film, and the fourth metallic film;
   thermally treating at a temperature of at least 1000 ° C. so that constituent elements of said second metallic film are diffused into a portion of said gate insulating film in said first region and constituent elements of said third metallic film are diffused into a portion of said gate insulating film in said second region; and
   after the thermally treating, forming source and drain regions using the gate electrode as a mask.

3. The method as set forth in claim 1,
   wherein said second region is an NMOS region and said second metallic film contains Al elements as constituent elements.

4. The method as set forth in claim 1,
   wherein said second region is a PMOS region and said second metallic film contains IIIa Group elements as constituent elements.

5. The method as set forth in claim 1,
   wherein said second region is a PMOS region and said second metallic film contains II Group elements as constituent elements.

6. The method as set forth in claim 1, further comprising:
   forming a conductive layer on said third metallic film;

etching said conductive layer through said first metallic film to form gate electrodes on said first region and said second region, respectively; and forming a source region and a drain region at said semiconductor substrate at both sides of each of said gate electrodes, thereby constituting a metal gate transistor as said semiconductor device.

7. The method as set forth in claim 1,
wherein said second metallic film contains constituent elements of said third metallic film.

8. The method as set forth in claim 3,
wherein said Al elements are reacted with oxygen elements of said gate insulating film to form dipoles of Al—O connection.

9. The method as set forth in claim 4,
wherein said IIIa Group elements are reacted with oxygen elements of said gate insulating film to form dipoles of IIIa Group element-O connection.

10. The method as set forth in claim 4,
wherein said second metallic film contains Tb elements.

11. The method as set forth in claim 6,
wherein said third metallic film functions as a barrier film to prevent a reaction between said second metallic film and said conductive layer.

12. The method as set forth in claim 2,
wherein said first region is an NMOS region and the third metallic film contains Al elements as constituent elements.

13. The method as set forth in claim 2,
wherein said second region is a PMOS region and said second metallic film contains IIIa Group elements as constituent elements.

14. The method as set forth in claim 2,
wherein said second region is a PMOS region and said second metallic film contains II Group elements as constituent elements.

15. The method as set forth in claim 2, further comprising:
forming a conductive layer on said fourth metallic film;
etching said conductive layer through said first metallic film to form gate electrodes on said first region and said second region, respectively; and
forming a source region and a drain region at said semiconductor substrate at both sides of each of said gate electrodes, thereby constituting a metal gate transistor as said semiconductor device.

16. The method as set forth in claim 2,
wherein said second metallic film and said third metallic film contain constituent elements of said fourth metallic film.

17. The method as set forth in claim 12,
wherein said Al elements are reacted with oxygen elements of said gate insulating film to form dipoles of Al—O connection.

18. The method as set forth in claim 13,
wherein said IIIa Group elements are reacted with oxygen elements of said gate insulating film to form dipoles of IIIa Group element-O connection.

19. The method as set forth in claim 15,
wherein said fourth metallic film functions as a barrier film to prevent a reaction between said second and third metallic films and said conductive layer.

20. The method as set forth in claim 18,
wherein said second metallic film contains La elements.

* * * * *